United States Patent
Li et al.

(10) Patent No.: US 11,957,002 B2
(45) Date of Patent: Apr. 9, 2024

(54) ARRAY SUBSTRATE, METHOD FOR PREPARING ARRAY SUBSTRATE, DISPLAY PANEL AND DISPLAY APPARATUS

(71) Applicants: Hefei Xinsheng Optoelectronics Technology Co., Ltd., Hefei (CN); BOE Technology Group Co., Ltd., Beijing (CN)

(72) Inventors: Wei Li, Beijing (CN); Jingjing Xia, Beijing (CN); Bin Zhou, Beijing (CN); Shengping Du, Beijing (CN); Yang Zhang, Beijing (CN); Wei Song, Beijing (CN); Qinghua Guo, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 422 days.

(21) Appl. No.: 17/414,751

(22) PCT Filed: Dec. 29, 2020

(86) PCT No.: PCT/CN2020/141035
§ 371 (c)(1),
(2) Date: Jun. 16, 2021

(87) PCT Pub. No.: WO2021/143523
PCT Pub. Date: Jul. 22, 2021

(65) Prior Publication Data
US 2023/0363207 A1    Nov. 9, 2023

(30) Foreign Application Priority Data
Jan. 17, 2020   (CN) .......................... 202010053089.3

(51) Int. Cl.
*H10K 59/122*    (2023.01)
*H10K 59/12*    (2023.01)
*H10K 59/80*    (2023.01)

(52) U.S. Cl.
CPC ....... *H10K 59/122* (2023.02); *H10K 59/1201* (2023.02); *H10K 59/8792* (2023.02)

(58) Field of Classification Search
CPC ............. H10K 59/122; H10K 59/1201; H10K 59/8792
See application file for complete search history.

(56) References Cited

U.S. PATENT DOCUMENTS 4,904,056 A * 2/1990 Castleberry ......... G02F 1/13394
349/110
2006/0220543 A1  10/2006 Makiura
(Continued)

FOREIGN PATENT DOCUMENTS

CN          102082164 A       6/2011
CN          103928497 A       7/2014
(Continued)

OTHER PUBLICATIONS

CN202010053089.3 first office action.

*Primary Examiner* — Yasser A Abdelaziez
(74) *Attorney, Agent, or Firm* — IPro, PLLC

(57) ABSTRACT

An array substrate, a preparing method thereof, a display panel and a display apparatus are disclosed. The array substrate includes: a base substrate (1); a driving circuit structure (2) on the base substrate (1); a planarization layer (3) and a plurality of electrode structures (4) successively located on a side, facing away from the base substrate (1), of the driving circuit structure (2); insulation structures (5) in gap areas between adjacent electrode structures (4); and pixel defining structures (6) on a side, facing away from the base substrate (1), of the insulation structures (5). The (Continued)

thickness of the insulation structures (5) is not smaller than the thickness of the electrode structures (4). An orthographic projection of the pixel defining structures (6) on the base substrate (1) at least completely covers the insulation structures (5).

20 Claims, 8 Drawing Sheets

(56) References Cited

U.S. PATENT DOCUMENTS

| | | | |
|---|---|---|---|
| 2011/0127500 A1* | 6/2011 | Ko | ................ H10K 59/35 |
| | | | 438/35 |
| 2013/0330868 A1 | 12/2013 | Suh | |
| 2015/0280171 A1 | 10/2015 | Ko et al. | |
| 2016/0254331 A1* | 9/2016 | Wang | ................ H10K 59/122 |
| | | | 257/40 |
| 2017/0104042 A1 | 4/2017 | Wang et al. | |
| 2020/0219949 A1 | 7/2020 | Zhang | |

FOREIGN PATENT DOCUMENTS

| | | |
|---|---|---|
| CN | 104752490 A | 7/2015 |
| CN | 105826358 A | 8/2016 |
| CN | 109860239 A | 6/2019 |
| CN | 111129105 A | 5/2020 |
| JP | 2011113815 A | 6/2011 |

\* cited by examiner

-- Prior Art --

-- Prior Art --

ARRAY SUBSTRATE, METHOD FOR PREPARING ARRAY SUBSTRATE, DISPLAY PANEL AND DISPLAY APPARATUS

CROSS-REFERENCE TO RELATED APPLICATIONS

This application is the National Stage of International Application No. PCT/CN2020/141035, filed on Dec. 29, 2020, which claims the priority of the Chinese patent application No. 202010053089.3 filed with the China National Intellectual Property Administration on Jan. 17, 2020 and entitled "Array substrate, Method for preparing array substrate, Display panel and Display apparatus", the entire contents of which are incorporated herein by reference.

FIELD

The present disclosure relates to the technical field of display, in particular to an array substrate, a method for preparing an array substrate, a display panel and a display apparatus.

BACKGROUND

Organic electro-luminescence display realizes the purposes of luminescence and display by current driving an organic semiconductor thin film. In the related art, a luminescence layer of an organic electro-luminescence device can be formed through ink-jet printing, which is applicable to both macromolecule luminescence materials and micromolecule luminescence materials, and has the advantages of low equipment cost and applicability to large-size production.

SUMMARY

In a first aspect, an array substrate provided by embodiments of the present disclosure includes: a base substrate, a driving circuit structure located on the base substrate, as well as a planarization layer and a plurality of electrode structures which are successively located on a side, facing away from the base substrate, of the driving circuit structure.

The array substrate further includes insulation structures each located in a gap area between the adjacent electrode structures, and a thickness of the insulation structure is not smaller than a thickness of each of the adjacent electrode structures.

The array substrate further includes pixel defining structures. Each of the pixel defining structures is located on a side, facing away from the base substrate, of a respective insulation structure, and an orthographic projection of the pixel defining structure on the base substrate at least completely covers the insulation structure.

Optionally, in the array substrate provided by the embodiments of the present disclosure, the pixel defining structures include opening areas, and the opening areas are disposed in one-to-one correspondence with the electrode structures.

The opening areas at least expose parts of the electrode structures.

Optionally, in the array substrate provided by the embodiments of the present disclosure, a shape of the electrode structure includes a rectangular part, and the opening area of the pixel defining structure is elliptic or rounded rectangular.

An orthographic projection of each opening area on the base substrate is within an orthographic projection of the corresponding electrode structure on the base substrate.

Optionally, in the array substrate provided by the embodiments of the present disclosure, the thickness of the insulation structure is larger than the thickness of each of the adjacent electrode structures.

The pixel defining structures include: first structure units and second structure units, the first structure units extend in a row direction and are arranged successively in a column direction, and the second structure units extend in the column direction and are arranged successively in the row direction.

Each opening area is enclosed by parts of two of the first structure units and parts of two of the second structure units. Center axes of the parts of the first structure units and center axes of the parts of the second structure units are connected to form a closed graph which encloses the opening area.

In a direction, pointing from the opening area to the center axes, a distance between an upper surface of the pixel defining structure and the base substrate increases successively.

Optionally, in the array substrate provided by the embodiments of the present disclosure, a shape of the insulation structure is trapezoidal, and an area of a surface, close to a side of base substrate, of the insulation structure is larger than an area of a surface, remote from the side of the base substrate, of the insulation structure.

Optionally, in the array substrate provided by the embodiments of the present disclosure, a cross section of the pixel defining structure is semicircular.

Optionally, in the array substrate provided by the embodiments of the present disclosure, the base substrate includes: a display area and a non-display area enclosing the display area.

The non-display area includes alignment structures, and the alignment structures are configured to conduct alignment during formation of the electrode structures.

The alignment structures and the insulation structures are disposed on a same layer and made of a same material.

Optionally, in the array substrate provided by the embodiments of the present disclosure, hydrophilicity of the planarization layer, hydrophilicity of the insulation structures and hydrophilicity of the pixel defining structures decrease successively.

Optionally, in the array substrate provided by the embodiments of the present disclosure, a material of the planarization layer is an organic siloxane resin material.

A material of the pixel defining structures is a super-hydrophobic acrylic material.

Optionally, in the array substrate provided by the embodiments of the present disclosure, the electrode structures are reflective metal electrodes.

Optionally, in the array substrate provided by the embodiments of the present disclosure, a material of the insulation structures is a light shielding material.

Optionally, in the array substrate provided by the embodiments of the present disclosure, the thickness of the electrode structures is 50 nm-200 nm.

The thickness of the insulation structures is 500 nm-1000 nm.

In a second aspect, embodiments of the present disclosure further provide a method for preparing an array substrate, including:

providing a base substrate;

forming a driving circuit structure and a planarization layer on the base substrate successively;

forming insulation structures at preset positions;

disposing electrode structures between the adjacent insulation structures; and forming pixel defining structures on a side, facing away from the base substrate, of the insulation structures.

The thickness of the insulation structures is larger than the thickness of the electrode structures. An orthographic projection of the pixel defining structures on the base substrate covers an orthographic projection of the insulation structures on the base substrate and an orthographic projection of edges of the electrode structures on the base substrate.

In a possible implementation, according to the method for preparing the array substrate provided by the embodiments of the present disclosure, when the insulation structures are formed in gap areas between the adjacent electrode structures in a process, the method further includes:

forming alignment structures in a non-display area of the base substrate in the same process.

In a third aspect, embodiments of the present disclosure further provide a display panel, including the array substrate provided by any of the embodiments in the first aspect.

In a forth aspect, embodiments of the present disclosure further provide a display apparatus, including the display panel provided by the embodiments in the third aspect.

DETAILED DESCRIPTION OF THE EMBODIMENTS

As for an array substrate in the related art, when a luminescence layer of an organic electro-luminescence device is formed, a vacuum evaporation process can be adopted, that is, in the presence of a mask plate, a vacuum heating method is adopted to evaporate a luminescence material and form a film in a pixel area. The advantages of this process are good uniformity of film formation and no need of solvent, but there are some disadvantages such as a low material utilization rate, mere applicability for micro-molecule luminescence materials, large equipment investment and non-applicability for large-size products. In addition, an ink-jet printing process of a solution process can be adopted to accurately drop a luminescence material solution into a pixel pit and make the solvent volatilize to form a film. Compared with the vacuum evaporation process, ink-jet printing process is suitable for both macromolecular luminescence materials and micro-molecule luminescence materials, and has a high material utilization rate, low equipment cost and a high yield, and is easier for production of large-scale and large-size products.

Figure 1:
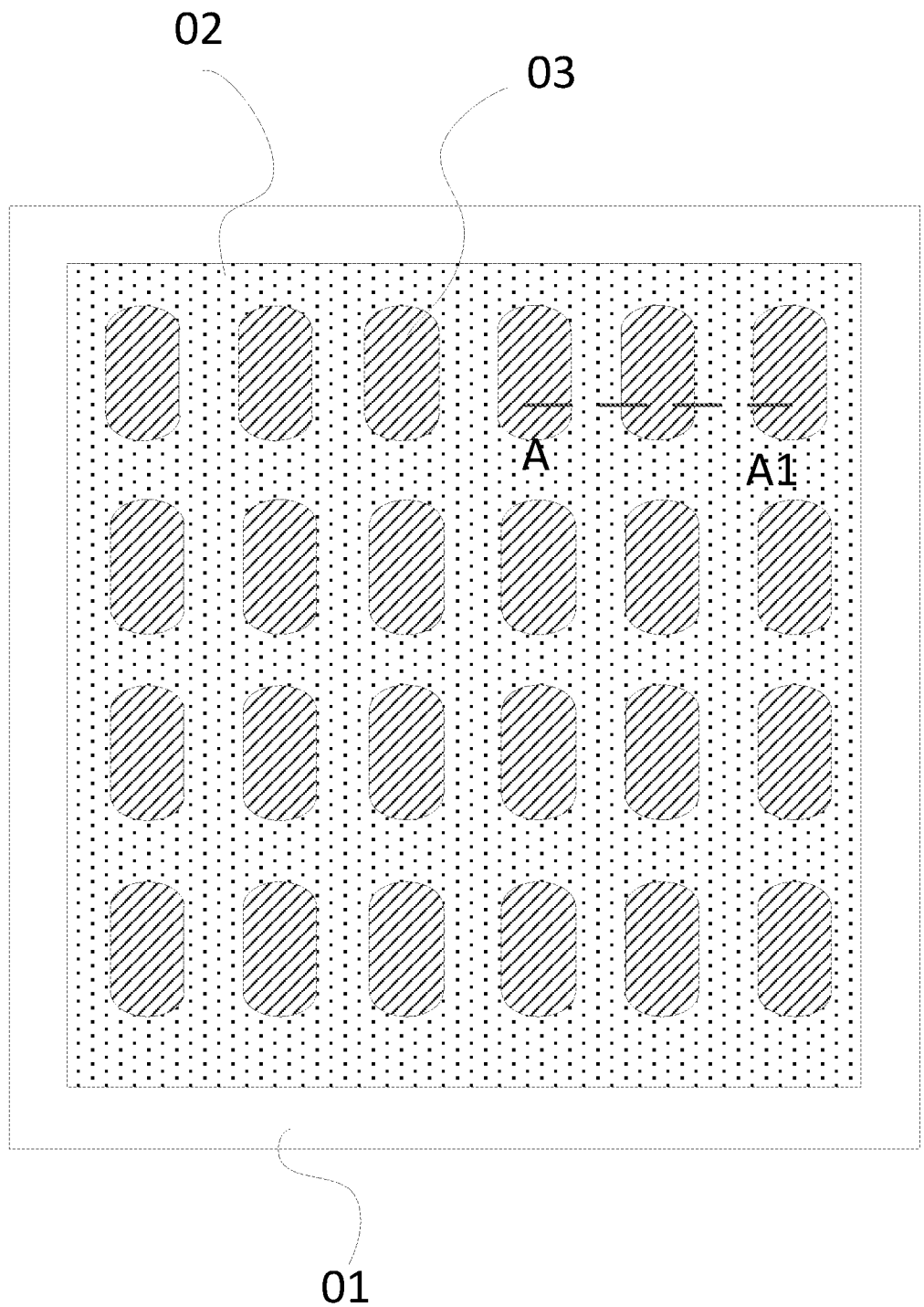
FIG. 1 is a schematic diagram of a plane structure of an array substrate in the related art.
Figure 2:
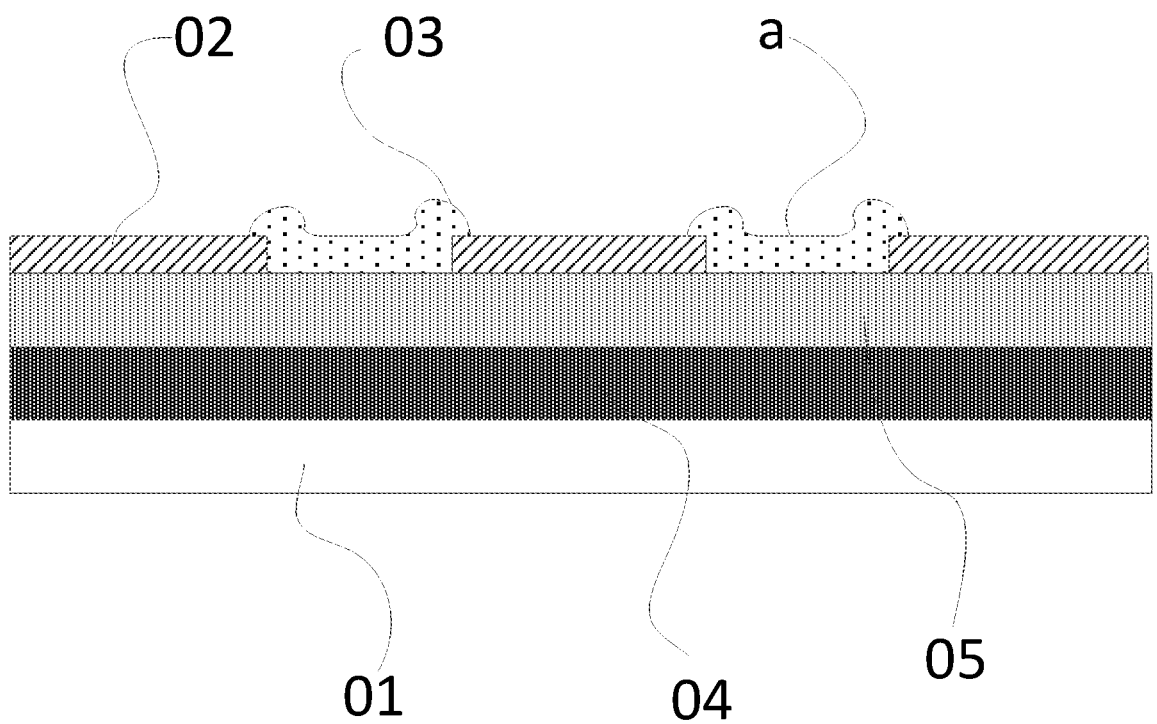
FIG. 2 is a schematic diagram of a sectional structure of FIG. 1 in A-A1 directions.

When the luminescence layer is formed through ink-jet printing, in order to enhance the film formation uniformity of the luminescence layer, as shown in FIG. 1 and FIG. 2, after formation of a driving circuit 04 on a base substrate 01, a planarization layer 05 is formed on a side, facing away from the base substrate 01, of the driving circuit 04, so that a breakage difference formed by the driving circuit 04 can be planarized. Then electrode structures 02 and pixel defining structures 03 are successively formed on the planarization layer 05. However, a gap area exists between the formed electrode structures 02, so that the pixel defining structures 03 formed on a side, facing away from the base substrate 01, of the electrode structures 02 have recessed areas 'a' in the gap areas. A certain amount of ink droplets are stored in the recessed areas 'a' during formation of the luminescence layer and thus light leak of pixels is caused.

In view of the above problems in the related art, embodiments of the present disclosure provide an array substrate, a method for preparing the array substrate, a display panel and a display apparatus. In order to make the purpose, technical solutions and advantages of this disclosure clearer, implementations of the array substrate, the method for preparing the array substrate, the display panel and the display apparatus provided by the embodiments of the present disclosure will be described in detail below with reference to the accompanying drawings. It should be understood that the preferred embodiments described below are only for illustration and explanation of the present disclosure, and are not intended to limit the present disclosure. In addition the embodiments in this application and the features in the embodiments can be combined with each other without conflict.

Unless otherwise defined, technical terms or scientific terms used in this disclosure shall have the ordinary meaning understood by those of ordinary skill in the art to which this disclosure belongs. As used in this disclosure, "first", "second" and similar words do not indicate any order, quantity or importance, but are only used to distinguish different components. Similar words such as "including" or "containing" mean that the elements or objects appearing before the word cover the listed elements or objects appearing after the word and their equivalents, but do not exclude other elements or objects. Similar words such as "connect" or "connected" are not limited to physical or mechanical connection, but can include electrical connection, whether direct or indirect. "Upper", "lower", "left" and "right" are only used to express the relative positional relationship. When the absolute position of the described object changes, the relative positional relationship may change accordingly.

Shapes and sizes of each component in the accompanying drawings do not reflect true scales, but are only for illustrating contents in the present disclosure.

Figure 3:
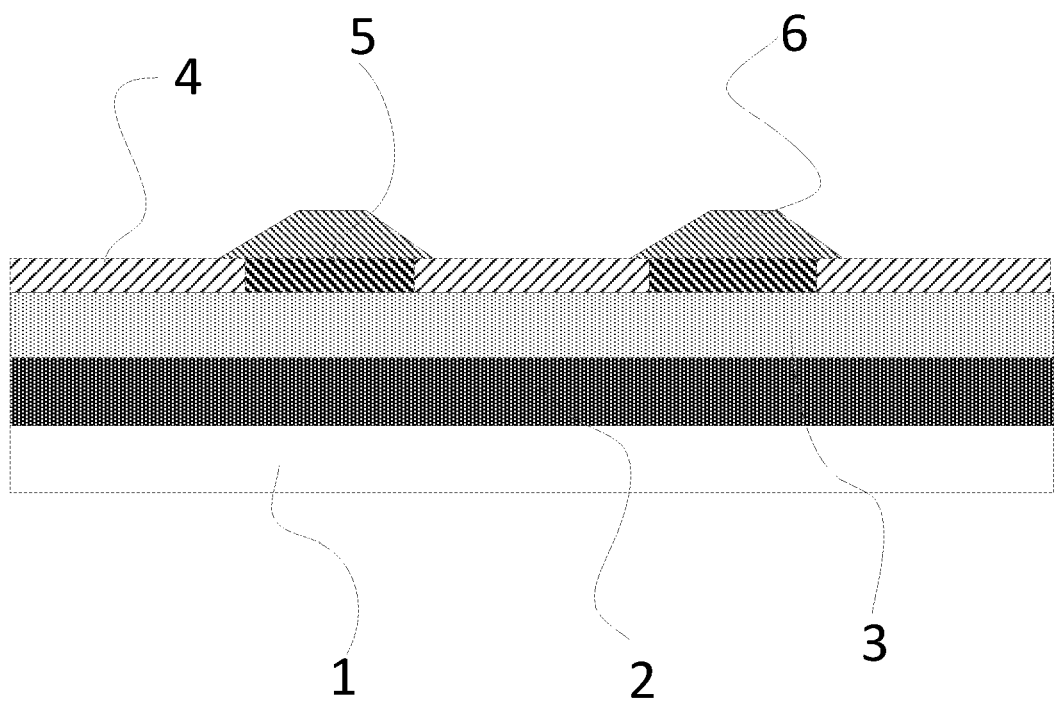
FIG. 3 is a first schematic structural diagram of an array substrate provided by an embodiment of the present disclosure.
Figure 4:
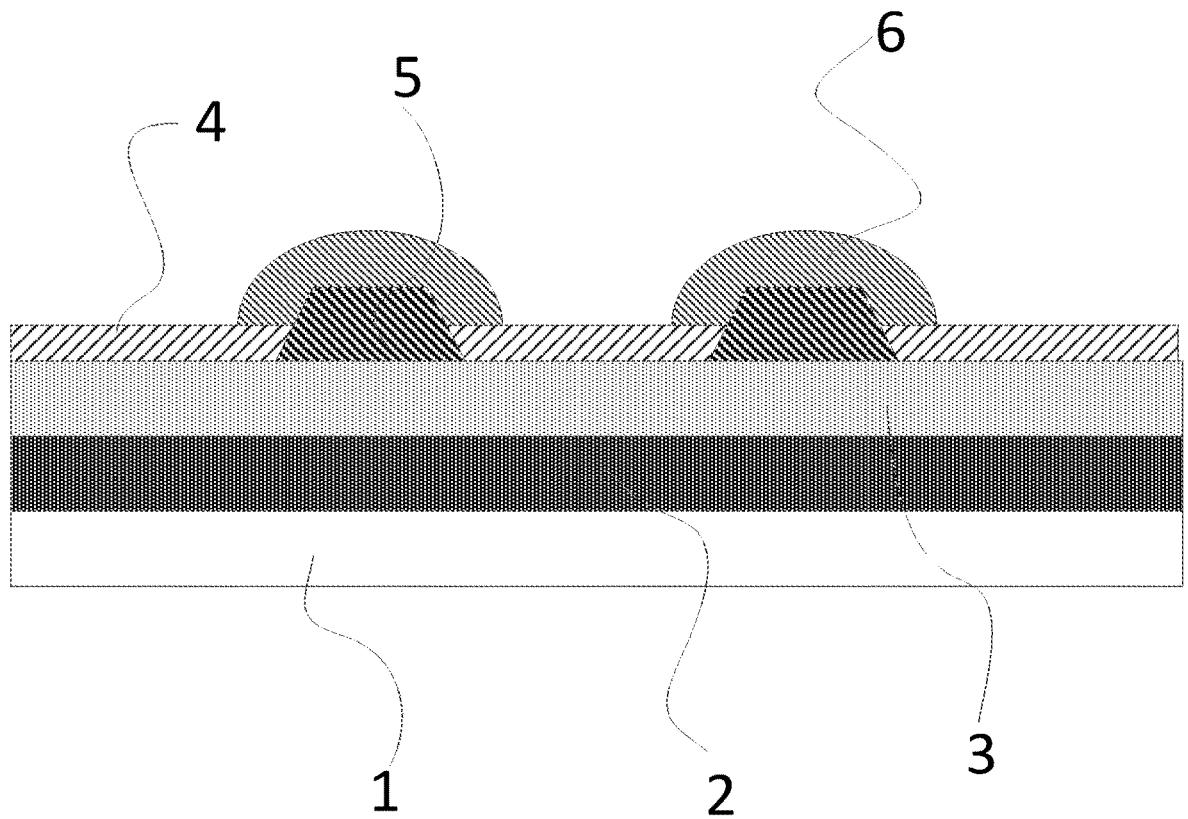
FIG. 4 is a second schematic structural diagram of an array substrate provided by an embodiment of the present disclosure.

Embodiments of the present disclosure provide an array substrate. As shown in FIG. 3 and FIG. 4, the array substrate includes: a base substrate 1, a driving circuit structure 2 on the base substrate 1, as well as a planarization layer 3 and a plurality of electrode structures 4 which are successively located on a side, facing away from the base substrate 1, of the driving circuit structure 2.

The array substrate further includes insulation structures 5 and pixel defining structures 6.

Each of the insulation structures 5 is located in a gap area between the adjacent electrode structures 4. A thickness of the insulation structure 5 is not smaller than a thickness of the electrode structure 4.

Each of the pixel defining structures 6 is located on a side, facing away from the base substrate 1, of the insulation structure 5. An orthographic projection of the pixel defining structure 6 on the base substrate 1 at least completely covers the insulation structure 5.

In the array substrate provided by the embodiments of the present disclosure, the insulation structures are disposed and the thickness of the insulation structures is not smaller than the thickness of the electrode structures, so that during formation of the pixel defining structures, no recessed area is formed in the gap areas any longer, ink droplets for formation of a luminescence layer cannot be stored and thus a light leak problem of pixels is relieved.

In the array substrate provided by the embodiments of the present disclosure, an orthographic projection of the pixel defining structure on the base substrate at least covering the insulation structure, means that: the pixel defining structure completely covers the insulation structure only, or the pixel defining structure covers the insulation structure and a part of the electrode structure so as to expose the uncovered part of the electrode structure and form the luminescence layer on the exposed part (uncovered part) of electrode structure. A choice can be made according to actual situations, which is not limited here.

It should be noted that, in the array substrate provided by the embodiments of the present disclosure, the thickness of the insulation structures is larger than or equal to the thickness of the electrode structures, thus a breakage difference formed due to the electrode structures can be remedied, so that during formation of the pixel defining structures, no recessed area is formed by the pixel defining structure in the gap areas of the adjacent electrode structures, and thus a light leak problem of pixels is relieved.

Figure 5:
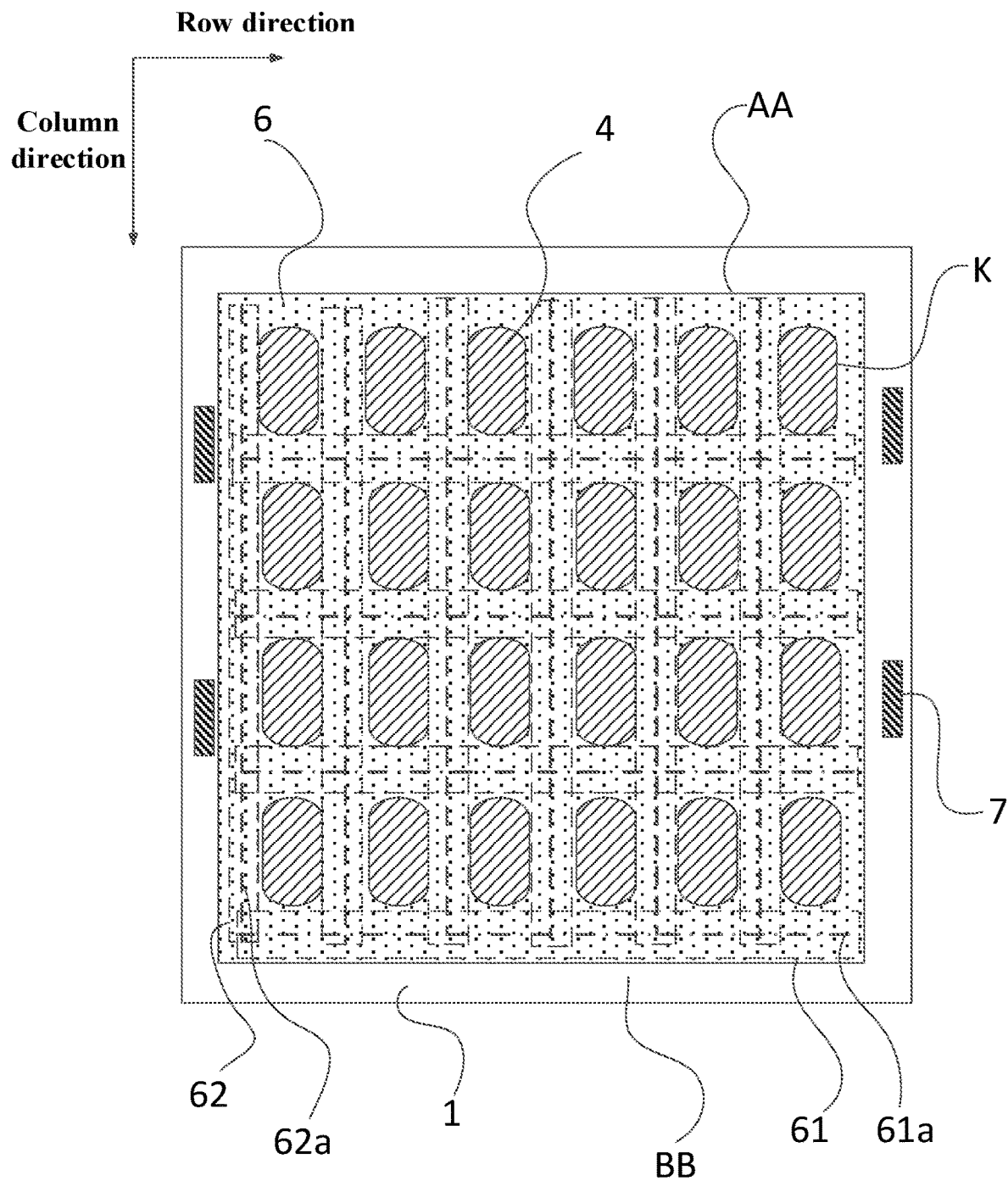
FIG. 5 is a third schematic structural diagram of an array substrate provided by an embodiment of the present disclosure.

Optionally, in the array substrate provided by the embodiments of the present disclosure, as shown in FIG. 4 and FIG. 5, the pixel defining structures 6 include opening areas K, and the opening areas K are disposed in one-to-one correspondence with the electrode structures 4.

The opening areas at least expose parts of the electrode structures 4.

In the array substrate provided by the embodiments of the present disclosure, the opening area of the pixel defining structure is an area where a pixel is located. The opening area is configured to store ink droplets of the luminescence layer. The ink droplets of the luminescence layer are defined in the opening area. Luminescence is realized under driving of the electrode structures after film is formed by the ink droplets. Configuration of the structure not only can reduce pixel light leak, but can also avoid light mixing of the adjacent pixels.

Optionally, in the array substrate provided by the embodiments of the present disclosure, as shown in FIG. 4 and FIG. 5, a shape of the electrode structure 4 includes a rectangular part, and the opening area of the pixel defining structure 6 is elliptic or rounded rectangular.

An area of an orthographic projection of the electrode structure 4 on the base substrate 1 is larger than an area of an orthographic projection of the opening area K on the base substrate 1.

In the array substrate provided by the embodiments of the present disclosure, the shape of the electrode structure may be rectangular. During formation of the pixel defining structure, a part of the electrode structure is covered by the pixel defining structure, so that an elliptic shape is formed in the opening area, and the area of the opening area is smaller than the area of the electrode structure. According to design of pixel arrangements of different array substrates, different shapes can be displayed by each electrode structure and each opening area. Those satisfying above configuration principles are within the claims of the present disclosure. The specific shape can be selected according to actual needs, which is not limited here.

It should be noted that, in the array substrate provided by the embodiments of the present disclosure, as shown in FIG. 3 and FIG. 4, a main body part of the electrode structure 4 is rectangular, and an electrode lead may also be included, of which the specific structure is not shown in the figures.

Optionally, in the array substrate provided by the embodiments of the present disclosure, as shown in FIG. 4 and FIG. 5, the thickness of the insulation structure 5 is larger than the thickness of the electrode structure 4.

The pixel defining structure 6 includes: first structure units 61 and second structure units 62. The first structure units 61 extend in a row direction and are arranged successively in a column direction, and the second structure units 62 extend in the column direction and are arranged successively in the row direction.

Each opening area K is enclosed by parts of two first structure units 61 and parts of two second structure units 62. Center axes (61a) of the parts of the first structure units 61 and center axes (62a) of the parts of the second structure units 62 are connected to form a closed graph which encloses the opening area K.

In a direction, pointing from the opening area K to the center axes (61a/62a), a distance between an upper surface of the pixel defining structure 6 and the base substrate 1 increases successively.

In the array substrate provided by the embodiments of the present disclosure, as shown in FIG. 4 and FIG. 5, when the thickness of the insulation structure 5 is larger than the thickness of the electrode structure 4, during formation of the pixel defining structure 6, the height of the pixel defining structure 6 is higher at a position corresponding to the insulation structure 5 than other positions. After the pixel defining structure 6 is patterned, the first structure units and the second structure units enclosing the opening area K may be of a slope shape in the direction, pointing from the opening area to the center axes. In other words, in the direction, pointing from the opening area to the center axes (61a/62a), the distance between the upper surface of the pixel defining structure 6 and the base substrate 1 increases successively. Based on the pixel defining structure of such shape, during formation of the luminescence layer, even the ink droplets fall onto the pixel defining structure, they can slide to the area where the pixel is located along the surface of the pixel defining structure, so that the corresponding luminescence layer is formed.

Optionally, in the array substrate provided by the embodiments of the present disclosure, as shown in FIG. 4, the insulation structure 5 is trapezoidal, and the area of the surface close to base substrate 1 is larger than the area of the surface remote from the base substrate 1.

In the array substrate provided by the embodiments of the present disclosure, the insulation structure is set to be a regular trapezoid. In the direction away from the base substrate, the width of the insulation structure decreases successively. When the pixel defining structure is formed on the insulation structure, an obvious bulge can be formed in the area where the insulation structure is located, so that the pixel defining structure with a slope can be formed easily, and the ink droplets used for forming the luminescence layer can slide into the opening area.

Optionally, in the array substrate provided by the embodiments of the present disclosure, as shown in FIG. 4, a cross section of the pixel defining structure is semicircular.

The cross section of the pixel defining structure is not strictly semicircular. The upper surface of the pixel defining structure may be arc and may be set symmetrically relative to the center axes. The lower surface of the pixel defining structure is in contact with the electrode structure and the insulation structure. Whether the lower surface is a plane depends on whether the thickness of the insulation structure is equal to that of the electrode structure. When the thickness of the insulation structure is equal to that of the electrode structure, the lower surface of the pixel defining structure is a plane. When the thickness of the insulation structure is not equal to that of the electrode structure, the lower surface of the pixel defining structure is of a grooved structure.

Optionally, in the array substrate provided by the embodiments of the present disclosure, as shown in FIG. 5, the base substrate 1 includes: a display area AA and a non-display area BB enclosing the display area AA.

The non-display area BB includes alignment structures 7. The alignment structures 7 are configured to conduct alignment during formation of the electrode structures 4.

The alignment structures 7 and the insulation structures 5 are disposed on a same layer and made of a same material.

As for an array substrate in the related art, when the electrode structure is formed, an exposure alignment mark is generally formed by patterning a first metal layer (gate). Because in a top emission electro-luminescence device, the corresponding electrode structure is only formed after the planarization layer is formed, there is no pattern segment difference profile as the alignment mark, which leads to the difficulty of alignment during exposure in the manufacturing process of the electrode structure, which is prone to causing alignment alarm, affecting the production rhythm and seriously affecting the product quality.

In the array substrate provided by the embodiments of the present disclosure, the alignment structures are formed in the non-display area on the base substrate when the insulation structures are formed, and the alignment structures and the insulation structures are formed by the same manufacturing process. When the electrode structures are formed, the alignment structures in the non-display area can be identified to improve the alignment accuracy.

In order to improve the performance of the planarization layer and make it achieve the flatness required by the electro-luminescence device, an organic siloxane resin (SOG) with a better leveling property can be used to fabricate the planarization layer, which has higher flatness and can meet the flatness required by the electro-luminescence device. The organic siloxane resin (SOG) is formed by heating, dehydration and cross-linking of small siloxane organic molecules. There are a lot of hydroxyl groups in the molecular structure of the SOG, and the hydrophilicity is high.

The pixel defining structure is a layer of organic barrier between pixel openings, which generally presents a regular trapezoidal structure with a narrow top and a wide bottom, so as to limit ink of ink-jet printing from overflowing around. The process for preparing the pixel defining structure generally includes coating, exposing, developing, curing and other processes of a material of the pixel defining structure, removing a photoresist material in the pixel opening area to form the pixel opening area and the area where the pixel defining structure is located. In order to prevent an ink-jet solution from sticking on the top of the pixel defining structure and ensure the uniformity of the luminescence layer, the pixel defining structure and the solution should be lyophobic to each other. Therefore, the material of the pixel defining structure is low in polarity and is generally a fluorine-containing material. However, in the related art, the pixel defining structure is directly in contact with the planarization layer, and the bonding force between them is low, which easily causes the pixel defining structure to fall off, resulting in poor pixels and affecting the display quality.

Optionally, in the array substrate provided by the embodiments of the present disclosure, hydrophilicity of the planarization layer, hydrophilicity of the insulation structures and hydrophilicity of the pixel defining structures decrease successively.

In the array substrate provided by the embodiments of the present disclosure, the insulation structures are disposed between the planarization layer and the pixel defining structures, and hydrophilicity of the insulation structures is designed, so that the hydrophilicity of the insulation structures falls between that of the planarization layer and that of the pixel defining structures. Compared with the related art in which the pixel defining structures are directly made to be in contact with the planarization layer, this configuration mode greatly increases bonding force between the pixel defining structures and the planarization layer, and ensures stability in bonding among different structures of the array substrate, thereby improving display quality.

Optionally, in the array substrate provided by the embodiments of the present disclosure, the material of the planarization layer may be an organic siloxane resin material.

The material of the pixel defining structures may be a super-hydrophobic acrylic material.

In the array substrate provided by the embodiments of the present disclosure, the organic siloxane resin material is high in liquidity and has higher flatness, which can better reach the flatness required by the electro-luminescence device. The pixel defining structure is made from the super-hydrophobic material which can prevent the ink-jet solution from sticking on the top of the pixel defining structure and ensure the uniformity of the luminescence layer.

Optionally, in the array substrate provided by the embodiments of the present disclosure, the electrode structures may be reflective metal electrodes.

In the array substrate provided by the embodiments of the present disclosure, the electrode structures are designed to be the reflective metal electrodes which can reflect light irradiated thereon, so that performance attenuation of a thin film transistor caused by light irradiation in the driving circuit structure can be avoided.

Optionally, in the array substrate provided by the embodiments of the present disclosure, the material of the insulation structures may be a light shielding material.

In the array substrate provided by the embodiments of the present disclosure, the insulation structure may be designed as a light shielding insulation structure, that is, the insulation structure is made from the light shielding material. By such configuration, light in the gap area between the electrode structures can be shielded, thereby preventing influences on the performance of the thin film transistor in the gap area. The light shielding material may be an organic silicon light shielding material or a black acrylic material. It may be other light shielding insulation materials, which is not limited here.

Optionally, in the array substrate provided by the embodiments of the present disclosure, the thickness of the electrode structures may be 50 nm-200 nm.

The thickness of the insulation structures may be 500 nm-1000 nm.

When the thickness of the electrode structures and the thickness of the insulation structures meet the above conditions, the pixel defining structures formed later can form a structure with a higher middle and lower edges. Hence, during formation of the luminescence layer, the ink droplets will not be stored in the pixel defining structures and thus light leak of the pixels is reduced.

Next, with FIG. 4 and FIG. 6A to 6C as the example, a process of preparing the array substrate is illustrated.

Figure 6A:
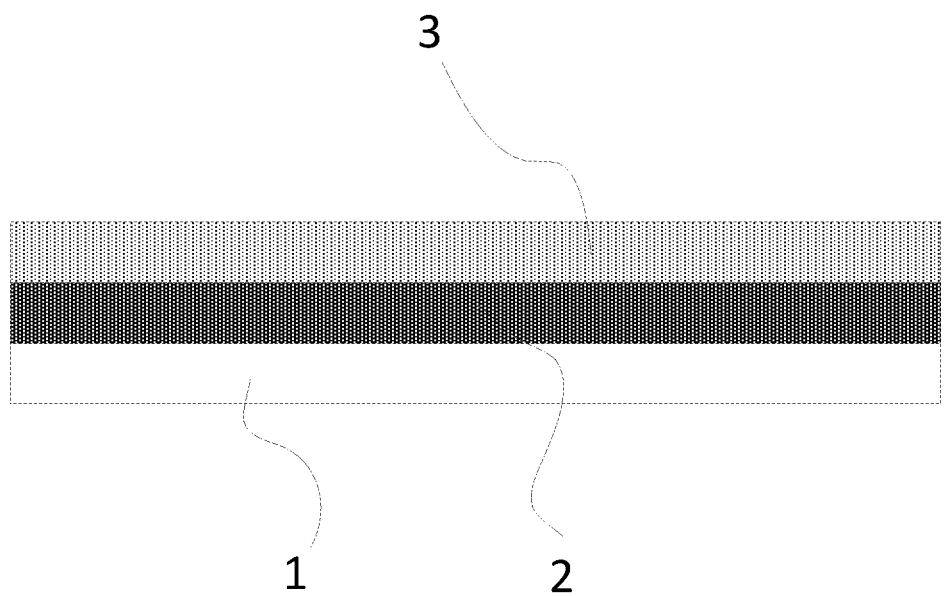
FIG. 6A to FIG. 6C are schematic structural diagrams in a process of preparing an array substrate provided by an embodiment of the present disclosure.

As shown in FIG. 6A, a base substrate 1 is provided, and a driving circuit structure 2 and a planarization layer 3 are formed on the base substrate 1. The manufacturing process of the driving circuit structure 2 and the planarization layer 3 are the same as the related art, which is not repeated here.

The driving circuit structure may include a light shielding metal layer, a buffer layer, an active layer, a gate insulation layer, a gate, an interlayer dielectric layer, source and drain electrodes, a passivation layer, etc. The planarization layer realizes film formation by processes such as coating, pre-baking and post-baking, etc.

Figure 6B:
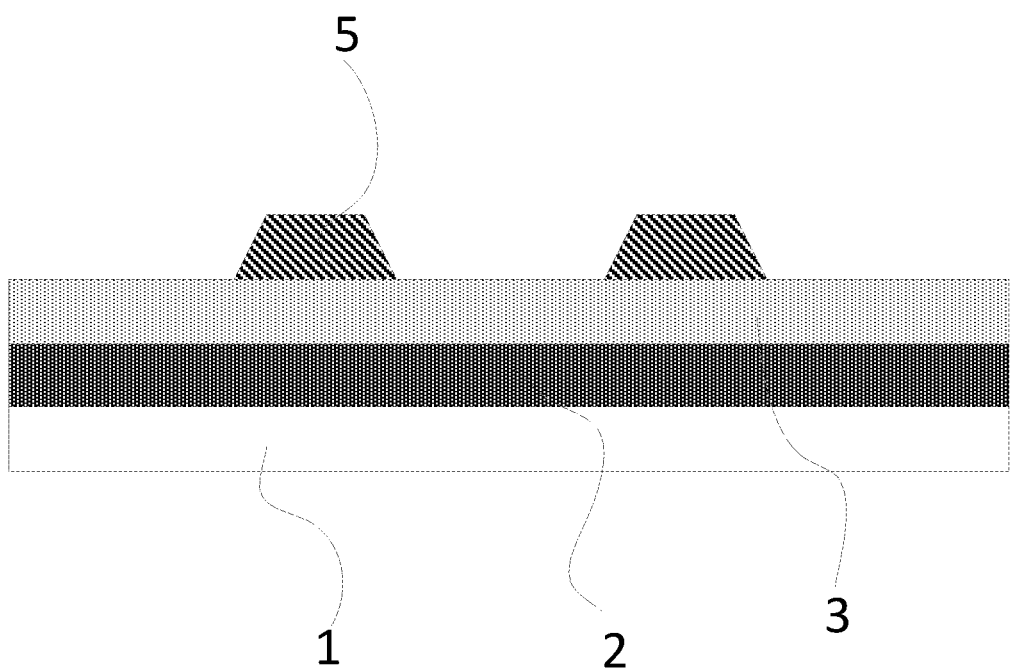

As shown in FIG. 6B, insulation structures 5 are formed at preset positions by a photolithography process. The preset positions are gap areas between two adjacent electrode structures.

It should be noted that, alignment structures (not shown in the diagram) can be formed in a non-display area by the same process, so that the manufacturing process is reduced and production cost is saved.

Figure 6C:
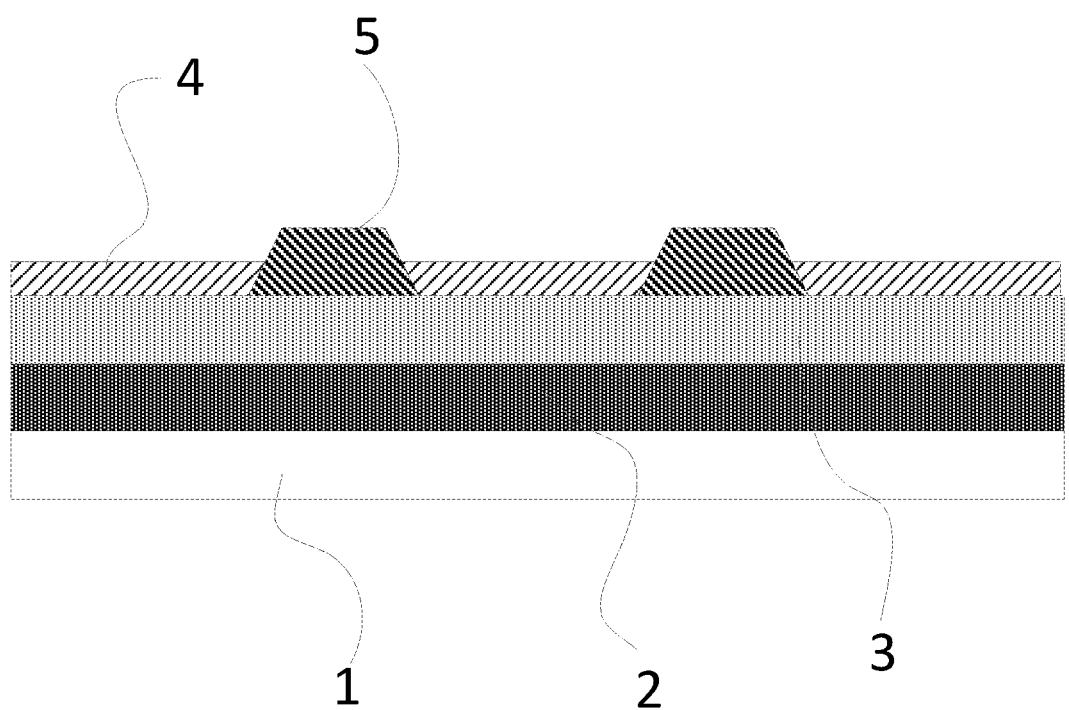

As shown in FIG. 6C, electrode structures 4 are formed on the base substrate 1, provided with the insulation structures 5, with the alignment structures (not shown in the diagram) as alignment marks, which can realized by processes such as film forming, exposing and developing and etching, etc.

After formation of the electrode structures 4, pixel defining structures 6 are formed on the base substrate 1. The formation process is the same as the formation process of the pixel defining structures in the related art, which is not repeated here. The formed structures are shown in FIG. 4.

Based on the same invention concept, embodiments of the present disclosure further provide a method for preparing an array substrate, including:
  providing a base substrate;
  forming a driving circuit structure and a planarization layer on the base substrate successively;
  forming insulation structures at preset positions;
  disposing electrode structures between adjacent insulation structures; and
  forming pixel defining structures on a side, facing away from the base substrate, of the insulation structures.

A thickness of the insulation structures is larger than a thickness of the electrode structure.

An orthographic projection of the pixel defining structure on the base substrate covers an orthographic projection of the insulation structure on the base substrate and an orthographic projection of an edge(s) of the electrode structure(s) on the base substrate.

Optionally, in the method for preparing the array substrate provided by the embodiments of the present disclosure, when the insulation structures are formed in gap areas between the adjacent electrode structures in a process, the method further includes:
  forming alignment structures n a non-display area of the base substrate in the same process.

The method for preparing the array substrate provided by the embodiments of the present disclosure has been described in detail in the above embodiments, which can be implemented with reference to the embodiments of the array substrate, which is not repeated here.

Based on the same invention concept, embodiments of the present disclosure further provide a display panel. The display panel includes the array substrate provided by any of the above embodiments, as well as a luminescence layer located in a pixel area and a driving electrode structure located on a side, facing away from the base substrate, of the luminescence layer.

The display panel further includes other necessary structures known by those of skill in the art, which is not repeated here.

Based on the same invention concept, embodiments of the present disclosure further provide a display apparatus including the display panel provided by the above embodiments.

The display panel and the display apparatus have all the advantages of the array substrate provided by the above embodiments, which can be implemented with reference to the embodiments of the array substrate, which is not repeated here.

The display apparatus may be any product or component with a display function such as a mobile phone, a tablet computer, a television, a monitor, a notebook computer, a digital photo frame, a navigator, etc. Existence of other essential components of the display apparatus should be understood by those of ordinary skill in the art, which will not be repeated here, nor should it be taken as a limitation of this disclosure. The implementation of the display apparatus can be known with reference to the above embodiments of the display panel, which is not repeated here.

Embodiments of the present disclosure provide an array substrate, a method for preparing an array substrate, a display panel and a display apparatus. The array substrate includes: a base substrate, a driving circuit structure located on the base substrate, as well as a planarization layer and a plurality of electrode structures which are successively located on a side, facing away from the base substrate, of the driving circuit structure. The array substrate further includes: insulation structures. Each of the insulation structures is located in a gap area between adjacent electrode structures, and the thickness of the insulation structure is not smaller than the thickness of each of the electrode structures. The array substrate further includes pixel defining structures. Each of the pixel defining structures is located on a side, facing away from the base substrate, of the insulation structure, and an orthographic projection of the pixel defining structure on the base substrate at least completely covers the insulation structure. The insulation structures are disposed and the thickness of the insulation structures is not smaller than the thickness of the electrode structures, so that during formation of the pixel defining structures, no recessed area is formed in the gap area any longer, ink droplets for formation of a luminescence layer cannot be stored and thus a light leak problem of pixels is relieved.

Obviously, those skilled in the art can make various modifications and variations to the present disclosure without departing from the spirit and scope of the present disclosure. Thus, if these modifications and variations of the present disclosure fall within the scope of the claims of the present disclosure and their equivalents, the present disclosure is also intended to include these modifications and variations.

What is claimed is:
1. An array substrate, comprising:
  a base substrate;
  a driving circuit structure on the base substrate,
  a planarization layer and a plurality of electrode structures successively located on a side, facing away from the base substrate, of the driving circuit structure;

insulation structures in gap areas between adjacent electrode structures among the plurality of electrode structures; wherein a thickness of the insulation structures is not smaller than a thickness of the electrode structures; and pixel defining structures on a side, facing away from the base substrate, of the insulation structures; wherein an orthographic projection of the pixel defining structures on the base substrate at least completely covers the insulation structures;

wherein hydrophilicity of the planarization layer, hydrophilicity of the insulation structures and hydrophilicity of the pixel defining structures decrease successively.

2. The array substrate according to claim 1, wherein:
the pixel defining structures comprise opening areas;
the opening areas are disposed in one-to-one correspondence with the electrode structures; and
the opening areas at least expose parts of the electrode structures.

3. The array substrate according to claim 2, wherein:
a shape of the electrode structure comprises a rectangular part;
the opening area of the pixel defining structure is elliptic or rounded rectangular; and
an orthographic projection of the opening areas on the base substrate is within an orthographic projection of the electrode structures on the base substrate.

4. The array substrate according to claim 2, wherein the thickness of the insulation structures is larger than the thickness of the electrode structures;
the pixel defining structures comprise:
first structure units extending in a row direction and arranged successively in a column direction; and
second structure units extending in the column direction and arranged successively in the row direction;
wherein each of the opening areas is enclosed by parts of two of the first structure units and parts of two of the second structure units;
center axes of the parts of the two first structure units and center axes of the parts of the two second structure units are connected to form a closed graph enclosing the each of the opening areas; and
in a direction, pointing from the each of the opening areas to the center axes, a distance between an upper surface of the pixel defining structure and the base substrate increases successively.

5. The array substrate according to claim 4, wherein:
a shape of the insulation structure is trapezoidal; and
an area of a surface, close to the base substrate, of the insulation structure is larger than an area of a surface, remote from the base substrate, of the insulation structure.

6. The array substrate according to claim 4, wherein a cross section of the pixel defining structure is semicircular.

7. The array substrate according to claim 1, wherein the base substrate comprises:
a display area; and
a non-display area enclosing the display area;
wherein the non-display area comprises alignment structures configured to conduct alignment during formation of the electrode structures; and
the alignment structures and the insulation structures are disposed on a same layer and made of a same material.

8. The array substrate according to claim 1, wherein:
a material of the planarization layer is an organic siloxane resin material; and a material of the pixel defining structures is a super-hydrophobic acrylic material.

9. The array substrate according to claim 1, wherein the electrode structures are reflective metal electrodes.

10. The array substrate according to claim 1, wherein a material of the insulation structures is a light shielding material.

11. The array substrate according to claim 1, wherein:
the thickness of the electrode structures is 50 nm-200 nm; and
the thickness of the insulation structures is 500 nm-1000 nm.

12. A method for preparing the array substrate according to claim 1, comprising:
providing the base substrate;
forming the driving circuit structure and the planarization layer on the base substrate successively;
forming the insulation structures at preset positions;
disposing the electrode structures between adjacent insulation structures among the formed insulation structures, wherein the thickness of the insulation structures is larger than the thickness of the electrode structures; and
forming the pixel defining structures on the side, facing away from the base substrate, of the insulation structures, wherein the orthographic projection of the pixel defining structures on the base substrate covers the orthographic projection of the insulation structures on the base substrate and an orthographic projection of edges of the electrode structures on the base substrate.

13. The method for preparing the array substrate according to claim 12, wherein when the insulation structures are formed in the gap areas between the adjacent electrode structures in a process, the method further comprises:
forming alignment structures in a non-display area of the base substrate in the same process.

14. A display panel, comprising the array substrate according to claim 1.

15. A display apparatus, comprising the display panel according to claim 14.

16. An array substrate, comprising:
a base substrate;
a driving circuit structure on the base substrate,
a planarization layer and a plurality of electrode structures successively located on a side, facing away from the base substrate, of the driving circuit structure;
insulation structures in gap areas between adjacent electrode structures among the plurality of electrode structures; wherein a thickness of the insulation structures is not smaller than a thickness of the electrode structures; and
pixel defining structures on a side, facing away from the base substrate, of the insulation structures; wherein an orthographic projection of the pixel defining structures on the base substrate at least completely covers the insulation structures;
wherein the pixel defining structures comprise opening areas, the opening areas are disposed in one-to-one correspondence with the electrode structures, and the opening areas at least expose parts of the electrode structures;
the thickness of the insulation structures is larger than the thickness of the electrode structures;
the pixel defining structures comprise:
first structure units extending in a row direction and arranged successively in a column direction; and second structure units extending in the column direction and arranged successively in the row direction;

wherein each of the opening areas is enclosed by parts of two of the first structure units and parts of two of the second structure units;

center axes of the parts of the two first structure units and center axes of the parts of the two second structure units are connected to form a closed graph enclosing the each of the opening areas; and in a direction, pointing from the each of the opening areas to the center axes, a distance between an upper surface of the pixel defining structure and the base substrate increases successively.

17. The array substrate according to claim 16, wherein:
a shape of the insulation structure is trapezoidal; and
an area of a surface, close to the base substrate, of the insulation structure is larger than an area of a surface, remote from the base substrate, of the insulation structure.

18. The array substrate according to claim 16, wherein a cross section of the pixel defining structure is semicircular.

19. The array substrate according to claim 16, wherein the base substrate comprises:
a display area; and
a non-display area enclosing the display area;
wherein the non-display area comprises alignment structures configured to conduct alignment during formation of the electrode structures; and
the alignment structures and the insulation structures are disposed on a same layer and made of a same material.

20. An array substrate, comprising:
a base substrate;
a driving circuit structure on the base substrate,
a planarization layer and a plurality of electrode structures successively located on a side, facing away from the base substrate, of the driving circuit structure;
insulation structures in gap areas between adjacent electrode structures among the plurality of electrode structures; wherein a thickness of the insulation structures is not smaller than a thickness of the electrode structures; and
pixel defining structures on a side, facing away from the base substrate, of the insulation structures; wherein an orthographic projection of the pixel defining structures on the base substrate at least completely covers the insulation structures;
wherein the base substrate comprises:
a display area; and
a non-display area enclosing the display area;
wherein the non-display area comprises alignment structures configured to conduct alignment during formation of the electrode structures; and
the alignment structures and the insulation structures are disposed on a same layer and made of a same material.

* * * * *